United States Patent
Liu et al.

(10) Patent No.: US 12,396,288 B2
(45) Date of Patent: Aug. 19, 2025

(54) FILM PREPARATION METHOD, SOLAR CELL, PHOTOVOLTAIC DEVICE, AND PHOTOVOLTAIC SYSTEM

(71) Applicant: TRINA SOLAR CO., LTD., Changzhou (CN)

(72) Inventors: Chengfa Liu, Changzhou (CN); Shuai Zhang, Changzhou (CN); Hong Chen, Changzhou (CN); Yugang Lu, Changzhou (CN); Wanli Li, Changzhou (CN); Yang Zou, Changzhou (CN)

(73) Assignee: TRINA SOLAR CO., LTD., Changzhou (CN)

( * ) Notice: Subject to any disclaimer, the term of this patent is extended or adjusted under 35 U.S.C. 154(b) by 0 days.

(21) Appl. No.: 18/369,946

(22) Filed: Sep. 19, 2023

(65) Prior Publication Data
US 2024/0347667 A1 Oct. 17, 2024

(30) Foreign Application Priority Data
Apr. 12, 2023 (CN) .......................... 202310388825.4

(51) Int. Cl.
H10F 71/00 (2025.01)
H10F 77/30 (2025.01)

(52) U.S. Cl.
CPC ........... H10F 71/00 (2025.01); H10F 77/311 (2025.01)

(58) Field of Classification Search
CPC .. H01L 31/18; H01L 31/02167; H10F 77/311; H10F 71/00
See application file for complete search history.

(56) References Cited

U.S. PATENT DOCUMENTS

| 4,828,628 A | 5/1989 | Hezel et al. |
| 10,991,834 B1 | 4/2021 | Li et al. |
| 2007/0238311 A1* | 10/2007 | Levy ................ C23C 16/545 438/765 |

(Continued)

FOREIGN PATENT DOCUMENTS

| CN | 203573989 U | 4/2014 |
| CN | 103531658 B | 11/2015 |

(Continued)

OTHER PUBLICATIONS

Granneman (Year: 2014).*

(Continued)

*Primary Examiner* — Sadie White
(74) *Attorney, Agent, or Firm* — Taft Stettinius & Hollister LLP

(57) ABSTRACT

The present application provides a film preparation method, a solar cell, a photovoltaic device, and a photovoltaic system. The film preparation method includes forming a first passivation layer on a first surface of a substrate by using a first preparation technique; and forming a second passivation layer on a surface of the first passivation layer away from the substrate by using a second preparation technique, a material of the second passivation layer is the same as that of the first passivation layer; wherein a passivation layer forming speed of the first preparation technique is lower than that of the second preparation technique, and a passivation effect of the first passivation layer is better than that of the second passivation layer.

8 Claims, 4 Drawing Sheets forming a first passivation layer on a first surface of a substrate by using a first preparation technique — 102 forming a second passivation layer on a surface of the first passivation layer away from the substrate by using a second preparation technique — 104

(56) References Cited

U.S. PATENT DOCUMENTS

| | | | |
|---|---|---|---|
| 2008/0231931 A1 | 9/2008 | Londergan et al. | |
| 2009/0165855 A1* | 7/2009 | Sun | H01L 31/02167 136/265 |
| 2011/0114992 A1* | 5/2011 | Schmid | H01L 23/3135 257/E33.059 |
| 2011/0146770 A1* | 6/2011 | Dieter | H01L 31/1868 136/255 |
| 2011/0180802 A1* | 7/2011 | Morosawa | H01L 29/7869 257/E33.001 |
| 2011/0265866 A1* | 11/2011 | Oh | H01L 31/056 438/57 |
| 2011/0297227 A1* | 12/2011 | Pysch | H10F 71/129 136/258 |
| 2012/0192943 A1 | 8/2012 | Vermang et al. | |
| 2012/0255612 A1* | 10/2012 | Pierreux | H01L 29/517 257/E31.043 |
| 2013/0109132 A1* | 5/2013 | Stewart | H01L 31/068 257/E31.124 |
| 2013/0149808 A1 | 6/2013 | Park et al. | |
| 2013/0247972 A1* | 9/2013 | Mungekar | H10F 77/311 438/57 |
| 2015/0001657 A1* | 1/2015 | Miyazaki | H01L 31/1804 257/431 |
| 2015/0047698 A1 | 2/2015 | Hollars | |
| 2015/0075605 A1* | 3/2015 | Miyamoto | H01L 31/022425 136/256 |
| 2015/0136221 A1* | 5/2015 | Miyazaki | H01L 31/068 136/256 |
| 2019/0326454 A1 | 10/2019 | Greer et al. | |
| 2020/0105516 A1 | 4/2020 | Fuchs et al. | |

FOREIGN PATENT DOCUMENTS

| | | |
|---|---|---|
| CN | 111540791 A | 8/2020 |
| CN | 111668317 A | 9/2020 |
| CN | 112117188 A | 12/2020 |
| CN | 113097342 A | 7/2021 |
| CN | 113437184 A | 9/2021 |
| CN | 113690328 A | 11/2021 |
| CN | 114420790 A | 4/2022 |
| CN | 115101605 A | 9/2022 |
| CN | 115132851 A | 9/2022 |
| CN | 115188833 A | 10/2022 |
| CN | 115706173 A | 2/2023 |
| CN | 218548445 U | 2/2023 |
| JP | 2011249813 A | 12/2011 |
| JP | 2015056529 A | 3/2015 |
| JP | 2015191907 A | 11/2015 |
| JP | 2016103642 A | 6/2016 |
| JP | 2022108026 A | 7/2022 |
| WO | 2012133692 A1 | 4/2012 |
| WO | 2013002285 A1 | 1/2013 |
| WO | 2013115275 A1 | 8/2013 |
| WO | 2013123225 A1 | 8/2013 |
| WO | 2017002747 A1 | 1/2017 |
| WO | 2017047311 A | 3/2017 |

OTHER PUBLICATIONS

Australian Patent Office, Examination Report No. 4 issued in corresponding Application No. 2023219826, dated Aug. 12, 2024, 9 pp.
Japanese Patent Office, Office Action issued in corresponding Application No. 2023-144248, dated Sep. 3, 2024, 6 pp.
Examination Report for corresponding Australian Application No. 2023219826 dated Sep. 28, 2023, 9 pages.
Australian Patent Office, Examination Report issued in corresponding Application No. 2023219826, dated May 23, 2024, 8 pp.
Australian Examination Report No. 2 for corresponding AU Application No. 2023219826, dated Feb. 6, 2024, 6 pages.
Chinese Office Action for corresponding CN Application No. 202310388825.4, dated Mar. 6, 2024, 7 pages.
European Search Report for corresponding EP Application No. 23194286.3, dated Jan. 29, 2024, 7 pages.
European Search Report for corresponding EP Application No. 23207160.5, dated Jan. 30, 2024, 7 pages.
Japanese Patent Office, Office Action issued in corresponding Application No. 2023-185209, dated Dec. 3, 2024, 9 pp.
Japanese Patent Office, Office Action issued in corresponding Application No. 2023-144248, dated Jan. 14, 2025, 4 pp.

* cited by examiner

FILM PREPARATION METHOD, SOLAR CELL, PHOTOVOLTAIC DEVICE, AND PHOTOVOLTAIC SYSTEM

CROSS-REFERENCE TO RELATED APPLICATION

This application claims priority to Chinese patent application No. 202310388825.4, filed on Apr. 12, 2023, and titled "THIN FILM PREPARATION METHOD, SOLAR CELL, PHOTOVOLTAIC DEVICE, AND PHOTOVOLTAIC SYSTEM", the content of which is hereby incorporated herein in its entirety by reference.

TECHNICAL FIELD

The present application relates to the field of film preparation technology, and in particular to film preparation methods, solar cells, photovoltaic devices and photovoltaic systems.

BACKGROUND

With the continuous development of semiconductor technology, the requirements for the performance of semiconductor devices are constantly increasing. Passivation is a technique that can significantly enhance the performance of a device. For example, the formation of a passivation layer in solar cells can significantly increase the photoelectric conversion efficiency of the solar cells. However, in order to form a passivation layer with a better passivation effect, the manufacturing efficiency of the device will be somewhat affected, resulting in insufficient production capacity of the device.

SUMMARY

In view of the above problems, there is a need to provide a film preparation method, a solar cell, a photovoltaic device, and a photovoltaic system, which can balance the passivation effect of the film and the manufacturing efficiency.

In a first aspect, the present application provides a film preparation method, including:
  forming a first passivation layer on a first surface of a substrate by using a first preparation technique;
  forming a second passivation layer on a surface of the first passivation layer away from the substrate by using a second preparation technique, a material of the second passivation layer being the same as that of the first passivation layer;
  wherein a passivation layer forming speed of the first preparation technique is lower than that of the second preparation technique, and a passivation effect of the first passivation layer is better than that of the second passivation layer.

In some embodiments, a hydrogen content in the first passivation layer is less than that in the second passivation layer.

In some embodiments, a negative charge density in the first passivation layer is greater than that in the second passivation layer.

In some embodiments, a first thickness of the first passivation layer is smaller than a second thickness of the second passivation layer.

In some embodiments, a first thickness of the first passivation layer is 2 nm to 6 nm.

In some embodiments, the first preparation technique includes atomic layer deposition.

In some embodiments, the forming the first passivation layer on the first surface of the substrate by using the first preparation technique includes:
  introducing a first precursor into a reaction chamber where the substrate is located;
  after a first predetermined time period, discharging the first precursor from the reaction chamber and introducing a second precursor, wherein the second precursor is adapted to react with the first precursor to form the first passivation layer;
  after a second predetermined time period, discharging the second precursor from the reaction chamber;
  repeating above until the thickness of the first passivation layer reaches the first thickness.

In some embodiments, the forming the first passivation layer on the first surface of the substrate by using the first preparation technique includes:
  controlling the substrate to move to sequentially pass through a first jet region, a second jet region, and a third jet region, wherein the first precursor is introduced to the first jet region, a spacing gas is introduced to the second jet region, and the second precursor is introduced to the third jet region: the second precursor is adapted to react with the first precursor to form the first passivation layer, the spacing gas is configured to space the first precursor from the second precursor, thereby suppressing reactions between the first precursor and the second precursor in areas other than on the first surface of the substrate;
  repeating above until the thickness of the first passivation layer reaches the first thickness.

In some embodiments, the forming the first passivation layer on the first surface of the substrate by using the first preparation technique includes:
  controlling the substrate to move to sequentially pass through a first jet region, a gas-discharge region, and a third jet region, wherein the first precursor is introduced to the first jet region, and the second precursor is introduced to the third jet region; the second precursor is adapted to react with the first precursor to form the first passivation layer;
  repeating above until the thickness of the first passivation layer reaches the first thickness.

In some embodiments, the forming the first passivation layer on the first surface of the substrate by using the first preparation technique includes:
  controlling the substrate to move to sequentially pass through a first jet region and a third jet region, wherein the first precursor is introduced to the first jet region, and the second precursor is introduced to the third jet region; the second precursor is adapted to react with the first precursor to form the first passivation layer; a distance between the first jet region and the third jet region is determined according to flow rates and/or jet pressures of the first precursor and the second precursor;
  repeating above until the thickness of the first passivation layer reaches the first thickness.

In some embodiments, in the forming the first passivation layer on the first surface of the substrate by using the first preparation technique, the first passivation layer is also formed on a peripheral side surface of the substrate, the peripheral side surface is connected to the first surface.

In some embodiments, the second preparation technique includes plasma-enhanced chemical vapor deposition or alternately performed plasma-enhanced chemical vapor deposition and atomic layer deposition.

In some embodiments, the material of the second passivation layer and the material of the first passivation layer are both aluminum oxide.

In a second aspect, the present application provides a solar cell, including a substrate, a first passivation layer, and a second passivation layer, wherein the first passivation layer and the second passivation layer are prepared by the above-described film preparation method.

In a third aspect, the application provides a solar cell, including:
- a substrate;
- a first passivation layer, disposed on a first surface of the substrate;
- a second passivation layer, disposed on a surface of the first passivation layer away from the substrate, a material of the second passivation layer being the same as that of the first passivation layer;
- wherein a hydrogen content in the first passivation layer is less than that in the second passivation layer; and/or
- a negative charge density in the first passivation layer is greater than that in the second passivation layer.

In some embodiments, a first thickness of the first passivation layer is smaller than a second thickness of the second passivation layer.

In some embodiments, a first thickness of the first passivation layer is 2 nm to 6 nm.

In some embodiments, the first passivation layer is further disposed on a peripheral side surface of the substrate, and the peripheral side surface is connected to the first surface.

In some embodiments, the material of the second passivation layer and the material of the first passivation layer are both aluminum oxide.

In a fourth aspect, the present application provides a photovoltaic device, including a cell group, wherein the cell group includes a plurality of solar cells as described above connected with each other.

In a fifth aspect, the present application provides a photovoltaic system, including the above-described photovoltaic device.

In the embodiments of the above-described film preparation method, the first passivation layer is formed on the first surface of the substrate by using a first preparation technique, and the second passivation layer is formed on the surface of the first passivation layer away from the substrate by using a second preparation technique, wherein a material of the second passivation layer is the same as that of the first passivation layer, so that the first passivation layer and the second passivation layer made of the same material are more easily compatible with the preparation of other films or layers in the device. In addition, even made of the same material, the first passivation layer and the second passivation layer will have different passivation effects, due to the difference between the film-forming effects of different preparation techniques. Specifically, since the passivation effect of the first passivation layer is better than that of the second passivation layer, the first passivation layer which is adjacent to the substrate can provide good passivation to the substrate to ensure the performance of the device. In addition, since the passivation layer forming speed of the second preparation technique is higher than that of the first preparation technique, the second preparation technique can quickly increase the overall thickness of a passivation film including the first and second passivation layers to a target thickness, so that the passivation film with the target thickness has sufficient reliability. Therefore, the film preparation method of the embodiments of the present application can enjoy the benefits of both the first preparation technique and the second preparation technique, and effectively balance the overall passivation effect and preparation efficiency of the prepared film.

DETAILED DESCRIPTION

The present application will now be described in detail with reference to the accompanying drawings and embodiments in order to make the objects, technical solutions, and advantages of the present application more clear. The embodiments described herein are for the purpose of explaining the application and are not intended to limit the application.

The present application provides a film preparation method for forming passivation layers on a substrate surface to improve the performance of a semiconductor device. The semiconductor device can be, but is not limited to, a photoelectric device. The photoelectric device can be such as a photovoltaic cell, a semiconductor light-emitting device, etc. The photovoltaic cell can be such as a solar cell. In following embodiments of the present application, the film preparation method for forming the passivation layers of the solar cell is used as an example for illustration.

Specifically, a solar cell is a semiconductor device that converts light into electrical energy through the photoelectric effect. The solar cell technology has gone through the conversion from the conventional aluminum back surface field (BSF) cells to the passivated emitter and rear cells (PERCs), and then to the passivated emitter and rear cells with selective emitter (PERC+SE). Compared with conventional BSF cells, PERC+SE technology adds a laser SE secondary diffusion process and a back passivation process after the conventional diffusion process. The back passivation layer formed by the back passivation process is the main improved structure of PERC solar cells compared with the conventional cells. Due to the passivation layer covered on the back surface of the substrate, the back surface of the substrate is passivated, thereby improving a long-wave response, and reducing the surface recombination rate, thereby improving the photoelectric conversion efficiency of the solar cells.

Figure 1:
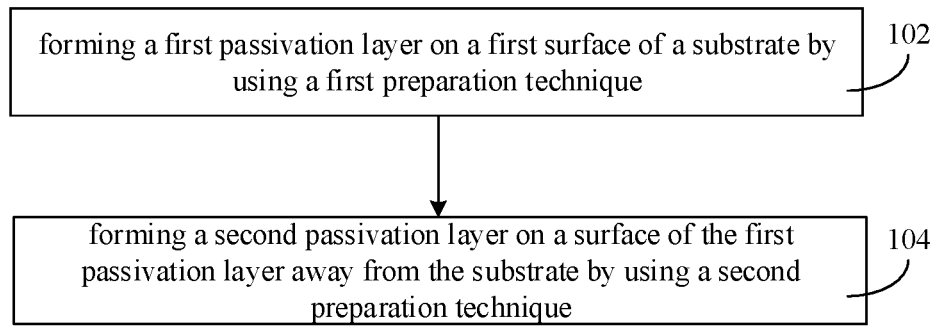
FIG. 1 is a flow chart of a film preparation method according to an embodiment.
Figure 2:
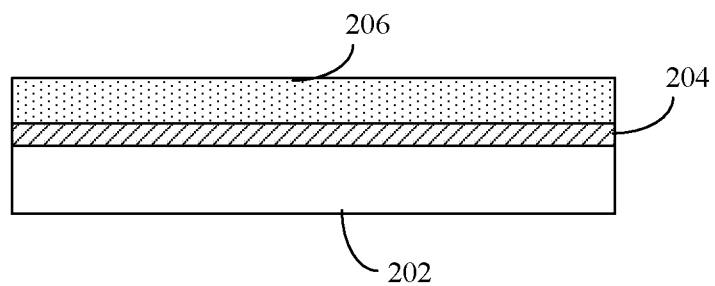
FIG. 2 is a schematic cross-sectional view of a solar cell according to an embodiment.

In an embodiment, the present application provides a film preparation method, and referring to FIG. 1 and FIG. 2, the film preparation method includes the following steps 102 to 104.

In step 102, a first passivation layer 204 is formed on a first surface of a substrate 202 by using a first preparation technique.

In step 104, a second passivation layer 206 is formed on a surface of the first passivation layer 204 away from the substrate 202 by using a second preparation technique.

The solar cell includes the substrate 202, and the substrate 202 is configured to receive incident light and to produce photogenerated carriers.

For example, the solar cell can be a tunnel oxide passivated contact (TOPCON) cell, and the two opposite surfaces of the substrate 202 can be configured to receive incident light. The substrate 202 can be an N-type semiconductor substrate 202, and that is, the substrate 202 is doped with N-type ions. The N-type ions can be any one of phosphorus (P), arsenic (As), or antimony (Sb). The substrate 202 includes a first surface and a second surface opposite to the first surface. An emitter is disposed on the second surface of the substrate 202. The emitter can be a P-type doped layer doped with P-type ions. The emitter and the substrate form a PN junction.

A tunnel layer and a doped polysilicon film are disposed on the first surface of the substrate 202. The tunnel layer together with the doped polysilicon film can form a passivation contact layer. The tunnel layer is configured to realize the interface passivation to the first surface of the substrate 202 to achieve a chemical passivation effect. Specifically, the interface defect density at the first surface of the substrate 202 is reduced by saturating the dangling bonds on the surface of the substrate 202, thereby reducing the recombination centers at the first surface of the substrate to reduce the carrier recombination rate. The material of the tunnel layer can be a dielectric material, such as at least one of silicon dioxide, magnesium fluoride, amorphous silicon, polysilicon, silicon carbide, silicon nitride, silicon oxynitride, aluminum oxide, or titanium dioxide. In some embodiment of the present application, the first passivation layer 204 and the second passivation layer 206 together can be used to form the tunnel layer. The tunnel layer can be combined with the dangling bonds on the first surface of the substrate 202, thereby inhibiting the carrier recombination on the surface of the solar cell, so as to improve the photoelectric conversion efficiency of the solar cell.

In some embodiments, a passivation film is provided on the side of the doped polysilicon film away from the tunnel layer. The passivation film can increase the carrier concentration on the surface of the substrate 202, inhibit carrier recombination, and increase the open circuit voltage, the short-circuit current, and the fill factor of the solar cell, and can improve the bifacial photoelectric conversion efficiency. In some embodiments, the material of the passivation film can be one or more of silicon dioxide, aluminum oxide, silicon nitride, silicon oxynitride, or silicon oxycarbonitride. In some embodiments of the present application, the first passivation layer 204 and the second passivation layer 206 together can also be used to form the passivation film.

In some embodiments, another passivation film is further disposed on the side of the emitter away from the substrate 202. The material of this passivation film can be one or more of silicon dioxide, aluminum oxide, silicon nitride, silicon oxynitride, or silicon oxycarbonitride. In some embodiment of the present application, the first passivation layer 204 and the second passivation layer 206 together can be used to form this passivation film.

In an embodiment of the present application, the second passivation layer 206 and the first passivation layer 204 are made of the same material. Specifically, in manufacturing a semiconductor device, there is a need to consider the characteristics of the materials of different films or layers, so as to prevent damage to the formed device structure in subsequent processes. In the present embodiment, the first passivation layer 204 and the second passivation layer 206 adopt the same material, so only the characteristics of one passivation layer material need to be considered from the above perspective, so that the present method is easier to be compatible with the preparation process of other films or layers in the device. In addition, the first passivation layer 204 and the second passivation layer 206 can be made of the material of a passivation layer in related art. Correspondingly, the preparation processes of other films or layers do not need to be adaptively adjusted, so that the influence of the method of the present embodiment on the preparation processes of the other films or layers can be reduced.

Moreover, it is understandable that even made of the same material, different film-forming effects exist in different preparation techniques, and thus the first passivation layer 204 and the second passivation layer 206 will have different passivation effects. Specifically, since the passivation effect of the first passivation layer 204 is better than that of the second passivation layer 206, the first passivation layer 204 which is adjacent to the substrate 202 can provide good passivation to the substrate 202 to ensure the performance of the device. In addition, since the passivation layer forming speed of the second preparation technique is higher than that of the first preparation technique, the second preparation technique can quickly increase the overall thickness of the passivation film to a target thickness, and the overall thickness is equal to a sum of the thicknesses of the first and second passivation layers 204, 206. The second passivation layer 206 can protect the first passivation layer 204, thereby effectively reducing the problems such as insufficient strength and easy damage caused by the first passivation layer 204 being too thin, so that the passivation film with the target thickness has sufficient reliability.

In the present embodiment, the film preparation method can enjoy the benefits of both the first preparation technique and the second preparation technique, and effectively balance the overall passivation effect and preparation efficiency of the prepared film.

In an embodiment, both the first passivation layer 204 and the second passivation layer 206 are made of aluminum oxide. Specifically, aluminum oxide not only can prevent unnecessary early recombination of electrons and holes, but also can act as a mirror to reflect light, redirecting the light to the active area of the solar cell and converting light energy into electricity, thereby further improving the photoelectric conversion efficiency of the solar cell. In other embodiments, the first passivation layer 204 and the second passivation layer 206 can be made of other same material, which is not limited herein.

In an embodiment, a first thickness of the first passivation layer 204 is smaller than a second thickness of the second passivation layer 206. For the convenience of description, in the embodiments of the present application, the sum of the first thickness and the second thickness is referred to as a target passivation thickness. The first thickness can be understood as the thickness of the first passivation layer when a sufficient passivation effect can be achieved on the substrate 202. When the first thickness is determined, the second thickness can be determined according to the target passivation thickness and the first thickness. The solar cell has a first photoelectric conversion efficiency when the first passivation layer 204 with the first thickness and the second passivation layer 206 with the second thickness are sequentially formed in the solar cell. The solar cell has a second photoelectric conversion efficiency when the passivation film with the target passivation thickness is entirely formed by using the first preparation technique. Optionally, the first photoelectric conversion efficiency can be compared with the second photoelectric conversion efficiency. On the condition that the difference between the first photoelectric conversion efficiency and the second photoelectric conversion efficiency is smaller than a preset threshold, it can be considered that the current thicknesses of the first and second passivation layers 204, 206 can achieve sufficient passivation to the substrate 202. In the present embodiment, since the preparation of the first passivation layer 204 by using the first preparation technique is relatively slow, by forming the first passivation layer 204 with a smaller thickness, the time for preparing the first passivation layer 204 by using the first preparation technique can be effectively reduced. Therefore, under the premise of ensuring the passivation effect, the preparation time for preparing the whole film is shortened.

In an embodiment, the first thickness of the first passivation layer 204 is 2 nm to 6 nm. For example, the first thickness can be any one of 2 nm, 3 nm, 5 nm, or 6 nm, which is not limited in the present embodiment. Correspondingly, the second thickness of the second passivation layer 206 can be adaptively adjusted according to the first thickness, so that the target passivation thickness meets the thickness requirement of the device. Further, an appropriate first thickness can be decided according to performance requirements of the device. For example, taking the target passivation thickness of 2.5 nm as an example, if the requirement for the photoelectric conversion efficiency of the solar cell is relatively low, the first passivation layer 204 with a thickness of 2 nm can be combined with the second passivation layer 206 with a thickness of 23 nm to form the passivation film; alternatively if the requirement for the photoelectric conversion efficiency of the solar cell is relatively high, the first passivation layer 204 with a thickness of 6 nm can be combined with the second passivation layer 206 with a thickness of 19 nm to form the passivation film. In the present embodiment, by forming the first passivation layer 204 with the first thickness ranged from 2 nm to 6 nm, the overall preparation time of the film and the passivation effect of the film can be better balanced.

Figure 3:
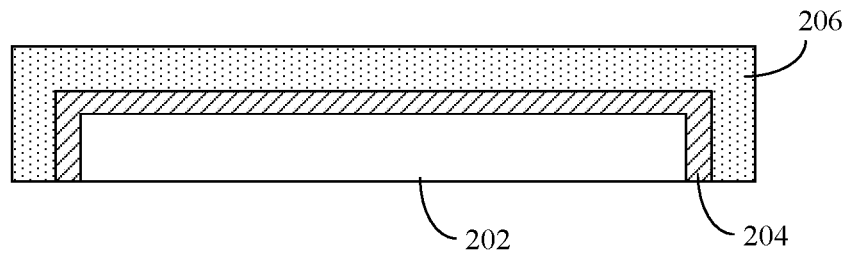
FIG. 3 is a schematic cross-sectional view of a solar cell according to another embodiment.

In an embodiment, referring to FIG. 3, in the forming of the first passivation layer 204 on the first surface of the substrate 202 by using the first preparation technique, the first passivation layer 204 is also formed on a peripheral side surface of the substrate 202. The peripheral side surface is connected to the first surface, and is parallel to the thickness direction of the substrate 202. Further, in the forming of the second passivation layer 206, the second passivation layer 206 is also formed on the peripheral side surface of the substrate 202 and covers the first passivation layer 204 on the peripheral side surface of the substrate 202. In the present embodiment, by forming the first passivation layer 204 on the peripheral side surface of the substrate 202, the carrier recombination rate at the peripheral side surface of the solar cell can be further reduced, thereby enhancing the photoelectric conversion efficiency of the solar cell.

In an embodiment, the first preparation technique includes atomic layer deposition (ALD). That is, the first passivation layer 204 is formed on the first surface of the substrate 202 by using ALD. ALD is a layer-by-layer deposition technique that can deposit a substance in a monatomic layer at a time on the surface of the substrate 202. Specifically, during atomic layer deposition, the chemical reactions of a new layer of atoms are directly related to the previous layer of atoms, so that one layer of atoms can be deposited per reaction. Therefore, atomic layer deposition can achieve nano-sized precise control of film thickness, and can easily obtain crack-free, dense, and conformal high-quality films. That is, the first passivation layer 204 formed by using atomic layer deposition can have a better passivation effect. In the present embodiment, since atomic layer deposition is based on a self-terminating surface-limited reaction between volatile precursor molecules and the substrate, the first passivation layer 204 can be formed with a uniform thickness and an excellent passivation effect to ensure the passivation effect of the first passivation layer 204 adjacent to the first surface of the substrate 202.

Figure 4:
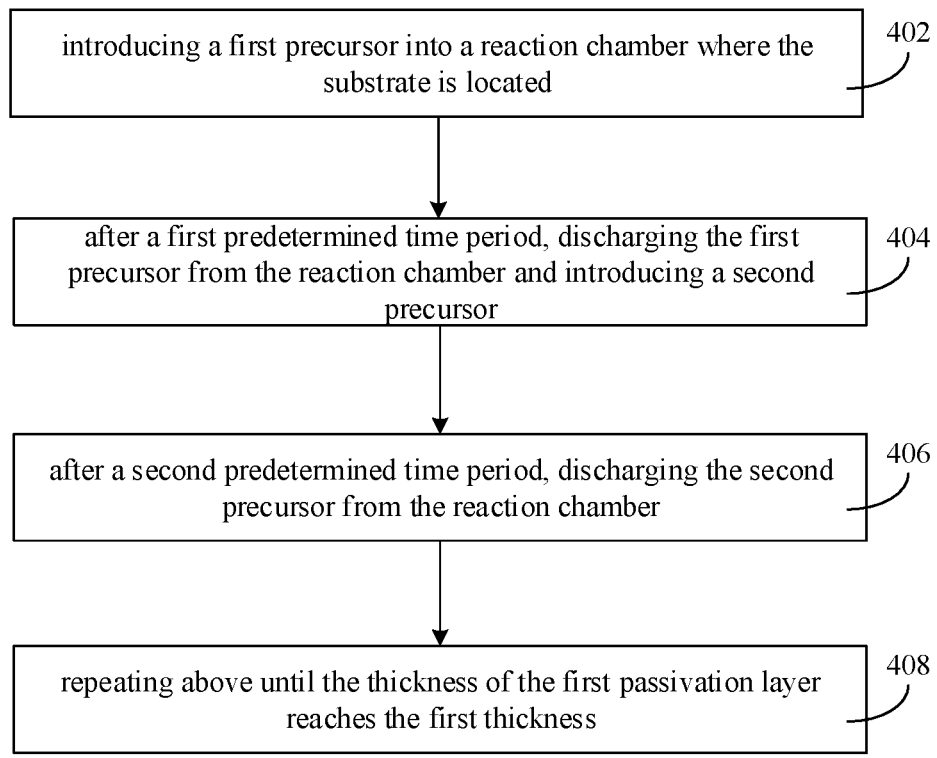
FIG. 4 is a flow chart of a process of forming a first passivation layer on a first surface of a substrate by using a first preparation technique according to an embodiment.

In an embodiment, referring to FIG. 4, the forming of the first passivation layer 204 on the first surface of the substrate 202 by using the first preparation technique includes following step 402 to step 408.

In step 402, a first precursor is introduced into a reaction chamber where the substrate 202 is located.

The reaction chamber can be provided with a plurality of jet heads, and different jet heads are configured to introduce different gaseous substances into the reaction chamber. The reaction chamber correspondingly includes a plurality of jet regions. The plurality of jet heads are disposed in the plurality of jet regions respectively in a one-to-one manner. Specifically, the gaseous substances that can be introduced include but are not limited to various precursors, inert gases, etc. Optionally, the jet heads can be mounted to the upper wall of the reaction chamber, and the gaseous substances are ejected along a direction perpendicular to the first surface of the substrate 202, so as to ensure that the first precursor can be evenly adsorbed on the first surface of the substrate 202. Further, taking the material of the first passivation layer 204 being aluminum oxide as an example, the first precursor is an aluminum source, such as trimethyl-aluminum (TMA).

In step 404, after a first predetermined time period, the first precursor in the reaction chamber is discharged and the second precursor is introduced.

Specifically, the second precursor is adapted to react with the first precursor to form the first passivation layer 204. The second precursor can be ejected through a jet head above the substrate 202, which is different from the jet head from which the first precursor is ejected. Taking the material of the first passivation layer 204 being aluminum oxide as an example, the second precursor is an oxygen source, such as at least one of water or ozone. Specifically, by discharging the first precursor from the reaction chamber after the first predetermined time period, the remaining first precursor can be effectively prevented from reacting with the subsequently introduced second precursor, thereby effectively avoiding adhering of the unwanted reaction product to the first surface of the substrate 202, which may affect the reaction on the first surface of the substrate 202 or result in uneven film formation on the first surface of the substrate 202. When the second precursor is introduced into the reaction chamber, the second precursor will react with the first precursor adsorbed on the first surface of the substrate 202 and generate corresponding reaction product until the first precursor adsorbed on the first surface is completely consumed, thereby forming the required atomic layer. Optionally, the first precursor can be discharged from the reaction chamber by using a vacuum pump, a molecular pump, etc., which is not limited in the present embodiment.

Further, the first predetermined time period refers to a period of time from the moment when the jet head begins to eject the first precursor to the moment when the first precursor just entirely covers the first surface of the substrate 202. Therefore, the first predetermined time period is related to at least one of the area of the first surface of the substrate 202, the volume of the reaction chamber, the flow rate and/or jet pressure of the first precursor introduced from the jet head, the distance between the jet head and the substrate 202, etc.

In step 406, the second precursor is discharged from the reaction chamber after a second predetermined time period.

Similar to step 404, the second predetermined time period refers to a period of time from the moment when the jet head begins to introduce the second precursor to the moment when the second precursor just entirely covers the first surface of the substrate 202. Therefore, the second predetermined time period is related to at least one of the area of the first surface of the substrate 202, the volume of the reaction chamber, the flow rate and/or jet pressure of the second precursor introduced from the jet head, the distance between the jet head and the substrate 202, etc.

In step 408, the above steps 402 to 406 are repeatedly performed until the thickness of the first passivation layer 204 reaches the first thickness.

Specifically, the number of time of repeating step 402 to 406 can be determined according to the thickness of a single atomic layer and the first thickness of the first passivation layer 204. For example, the above steps 402 to 406 can be repeated 20 to 50 times to form the first passivation layer 204 with the first thickness.

In the present embodiment, since all the first precursor molecules that are not adsorbed to the first surface of the substrate 202 have been discharged before the introducing of the second precursor, during the introducing of the second precursor, no reaction product of the first precursor and second precursor will be formed in an area other than on the first surface of the substrate 202. In this way, the separation in term of time between the first precursor and the second precursor is realized, so that a large proportion of the first precursor and the second precursor react on the first surface of the substrate 202. In addition, the first precursor reacts with the second precursor on the first surface of the substrate 202 through a strict self-control process, so that a uniform first passivation layer 204 with excellent passivation effect is finally formed.

Figure 5:
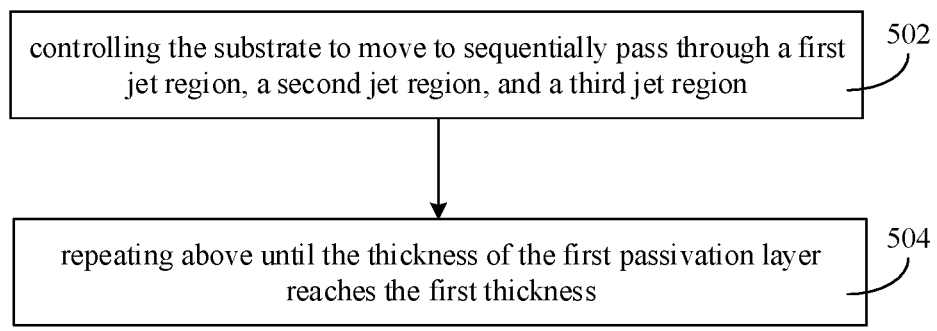
FIG. 5 is a flow chart of a process of forming a first passivation layer on a first surface of a substrate by using a first preparation technique according to another embodiment.

In an embodiment, referring to FIG. 5, the forming of the first passivation layer 204 on the first surface of the substrate 202 by using the first preparation technique includes following steps 502 to 504.

In step 502, the substrate 202 is controlled to move to sequentially pass through a first jet region, a second jet region, and a third jet region. The first precursor is introduced to the first jet region, a spacing gas is introduced to the second jet region, and the second precursor is introduced to the third jet region.

Figure 6:
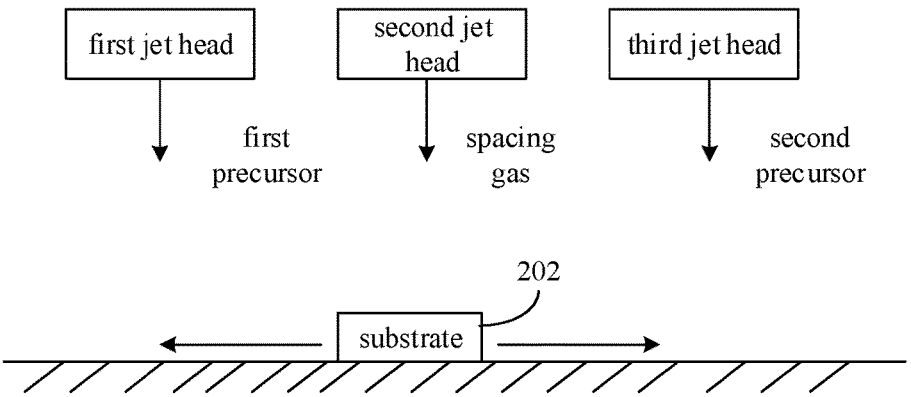
FIG. 6 is a schematic view of an arrangement of jet heads in an embodiment.

The second precursor is adapted to react with the first precursor to form the first passivation layer 204. The spacing gas is inert to the first and second precursors, and is configured to space the first precursor from the second precursor, thereby suppressing reactions between the first precursor and the second precursor in areas other than on the first surface of the substrate. Specifically, the spacing gas can inhibit the chemical vapor deposition of the gaseous first and second precursors before reaching the substrate 202, so that the reaction between the first precursor and the second precursor is only the atomic layer deposition on the first surface of the substrate 202, thereby improving the quality of the first passivation layer 204. The spacing gas can be nitrogen gas ($N_2$) or an inert gas. Specifically, referring to FIG. 6, the first precursor, the spacing gas, and the second precursor are respectively introduced through different jet heads, that is, a first jet head configured to eject the first precursor, a second jet head configured to eject the spacing gas, and a third jet head configured to eject the second precursor. The plurality of jet heads are disposed in one-to-one correspondence with the plurality of jet regions. The jet heads can be arranged in line on the upper wall of the reaction chamber. Optionally, the substrate 202 can be placed on a hot plate, and the substrate 202 is driven to pass through each jet region in sequence by controlling the movement of the hot plate, so as to facilitate heat treatment of the substrate 202.

Further, the moving speed of the substrate 202 can be determined according to flow rates and/or jet pressures of the gaseous substances introduced from the jet heads, so as to ensure the performance of atomic layer deposition. It can be understood that the performance of atomic layer deposition is related to the adsorption of the first precursor, the reaction with the second precursor, and the separation by the spacing gas. Therefore, the moving speed of the substrate 202, the flow rate and/or the jet pressure of the gaseous substances introduced from the jet heads, and the control logic of the jet heads can be appropriately adjusted according to the requirements for the atomic layer deposition. In an example, the jet heads can constantly introduce the corresponding gaseous substances into the reaction chamber, so as to simplify the control logic of the jet heads, and optimizing the adsorption of the first precursor, the reaction with the second precursor, and the separation by the spacing gas. In another example, the jet heads may only introduce the corresponding gaseous substances into the reaction chamber from the moment that the substrate 202 enters the corresponding jet regions, so as to save the materials. In another example, the jet heads corresponding to the precursors may be controlled to only introduce the corresponding precursors into the reaction chamber from the moment that the substrate 202 enters the corresponding jet regions, and the jet head corresponding to the spacing gas may be controlled to constantly introduce the spacing gas into the reaction chamber, so as to save the precursors while ensuring the spacing effect and the reaction.

In step 504, the above step 502 is repeatedly performed until the thickness of the first passivation layer 204 reaches the first thickness.

Figure 7:
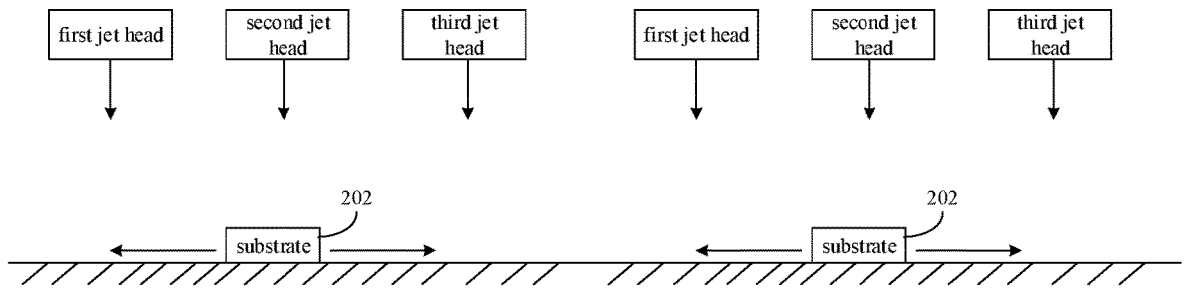
FIG. 7 is a schematic view of an arrangement of jet heads in another embodiment.

In some embodiments, multiple sets of jet heads can be arranged sequentially in the reaction chamber. For example, referring to FIG. 7 which shows two sets of jet heads, each set of jet heads includes a first jet head, a second jet head, and a third jet head. In other words, the multiple sets of jet heads are arranged in a sequence as a first jet head→a second jet head→a third jet head . . . a first jet head→a second jet head→a third jet head in the reaction chamber. The substrate 202 is controlled to move linearly so as to pass through the jet regions in sequence. This example requires a relatively large reaction chamber, but can realize fast processing of the substrate 202, and can process multiple substrates 202 synchronously by arranging the substrates 202 under different sets of jet heads, thereby greatly improving the preparation efficiency of the first passivation layer 204. In another example, referring to FIG. 6, only one set of jet heads can be arranged in the reaction chamber, after a cycle of reaction, the gaseous substances in the reaction chamber is completely evacuated, and the substrate 202 is moved to the first jet region again to repeat the former step. Although the preparation efficiency of this example is not as good as that of the previous example, it has lower requirement on the size of the reaction chamber, and thus is more suitable for small scale production.

Compared with the method in the embodiment shown in FIG. 4, which space the first precursor from the second precursor by separation of time through discharging the first precursor, in the present embodiment, the substrate 202 is controlled to pass through the first jet region, the second jet region, and the third jet region in sequence, which realizes a separation in term of space with no need of exhausting the reaction chamber, thereby greatly reducing the time required for forming the first passivation layer 204. By using the second jet region to actively separate the first precursor from the second precursor, and reasonably setting the width of the second jet region and the flow rate and/or jet pressure of the spacing gas, the first precursor and the second precursor can be effectively separated from each other, so that a large proportion of the first precursor and the second precursor react on the first surface of the substrate 202, thereby effectively improving the uniformity of the first passivation layer 204 and improving the passivation effect of the first passivation layer 204. Moreover, since the substrate 202 can be placed on the hot plate and is in continuous movement, the method of the present embodiment can reduce the wraparound phenomenon during forming of the first passivation layer 204. The wraparound phenomenon refers to the formation of a non-uniform film or layer on the opposite side of the substrate 202, which affects the appearance and photoelectric conversion performance of the solar cell. Therefore, the present embodiment can effectively reduce the above problems, thereby providing a solar cell with better comprehensive performance.

Figure 8:
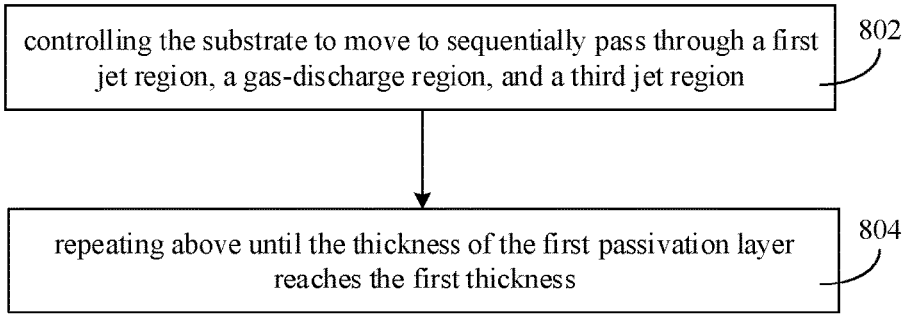
FIG. 8 is a flow chart of a process of forming a first passivation layer on a first surface of a substrate by using a first preparation technique according to another embodiment.

In an embodiment, referring to FIG. 8, the forming of the first passivation layer 204 on the first surface of the substrate 202 by using the first preparation technique includes following steps 802 to 804.

In step 802, the substrate 202 is controlled to move to sequentially pass through a first jet region, a gas-discharge region, and a third jet region, wherein the first precursor is introduced to the first jet region, and the second precursor is introduced to the third jet region. The gas-discharge region is configured to discharge gaseous substances in the gas-discharge region from the reaction chamber.

Figure 9:
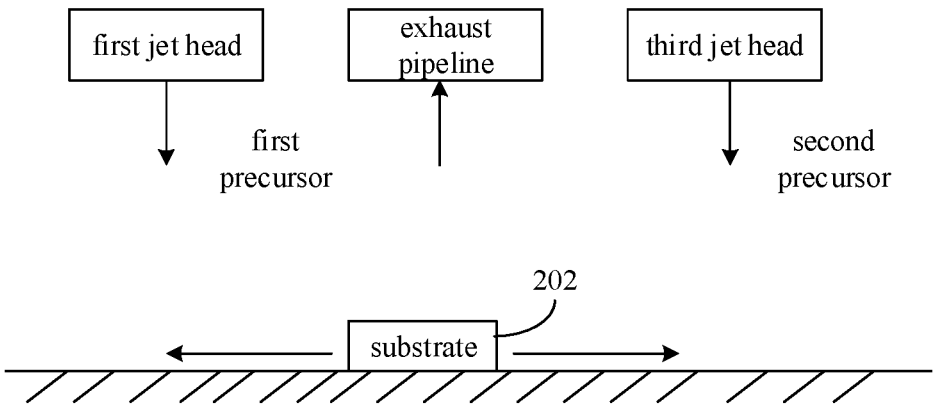
FIG. 9 is a schematic view of an arrangement of jet heads in yet another embodiment.

The second precursor is adapted to react with the first precursor to form the first passivation layer 204. Specifically, referring to FIG. 9, the first precursor and the second precursor are respectively introduced from different jet heads, that is, a first jet head is configured to eject the first precursor, and a third jet head is configured to eject the second precursor. In the present embodiment, an exhaust pipeline can be further disposed between the first jet head and the third jet head, and the exhaust pipeline can be connected to a vacuum pump, so as to realize the suction of gaseous substances from the gas-discharge region. It can be understood that, for the specific arrangement the first jet region and the third jet region, reference may be made to the embodiment in FIG. 5, which will not be repeated herein. By having the gas-discharge region, the first precursor or the second precursor diffused to the gas-discharge region can be discharged from the reaction chamber promptly to suppress the reaction between the first precursor and the second precursor, thereby improving the quality of the first passivation layer 204.

In step 804, the above step 802 is repeatedly performed until the thickness of the first passivation layer 204 reaches the first thickness.

In the present embodiment, the substrate 202 is controlled to pass through the first jet region, the gas-discharge region, and the third jet region in sequence, which realizes a separation in term of space with no need of exhausting the entire reaction chamber, thereby greatly reducing the time required for forming the first passivation layer 204. By using the gas-discharge region to separate the first precursor from the second precursor, and reasonably setting the width of the gas-discharge region, the first precursor and the second precursor can be effectively separated from each other, so that a large proportion of the first precursor and the second precursor react on the first surface of the substrate 202, thereby effectively improving the uniformity of the first passivation layer 204 and improving the passivation effect of the first passivation layer 204. Moreover, since the substrate 202 can be placed on the hot plate and is in continuous movement, the method of the present embodiment can reduce the wraparound phenomenon during forming of the first passivation layer 204. The wraparound phenomenon refers to the formation of a non-uniform film or layer on the opposite side of the substrate 202, which affects the appearance and photoelectric conversion performance of the solar cell. Therefore, the present embodiment can effectively reduce the above problems, thereby providing a solar cell with better comprehensive performance.

In an embodiment, the substrate 202 can be controlled to sequentially pass through the first jet region, the second jet region, the gas-discharge region, and the third jet region, wherein the first precursor is introduced to the first jet region, the spacing gas is introduced to the second jet region, and the second precursor is introduced to the third jet region. In another embodiment, the substrate 202 can be controlled to sequentially pass through the first jet region, the gas-discharge region, the second jet region, and the third jet region, wherein the first precursor is introduced to the first jet region, the spacing gas is introduced to the second jet region, and the second precursor is introduced to the third jet region. It can be understood that, for the specific arrangement of the first jet region, the second jet region, the exhaust region, and the third jet region, reference can be made to the above-described embodiments, and details are not repeated herein.

Figure 10:
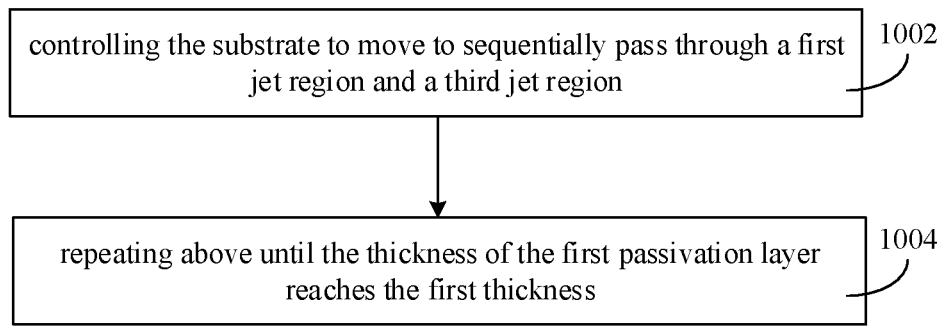
FIG. 10 is a flow chart of a process of forming a first passivation layer on a first surface of a substrate by using a first preparation technique according to yet another embodiment.

In an embodiment, referring to FIG. 10, the forming of the first passivation layer 204 on the first surface of the substrate 202 by using the first preparation technique includes following steps 1002 to 1004.

In step 1002, the substrate 202 is controlled to move to pass through a first jet region and a third jet region in sequence, wherein the first precursor is introduced to the first jet region, and the second precursor is introduced to the third jet region.

Figure 11:
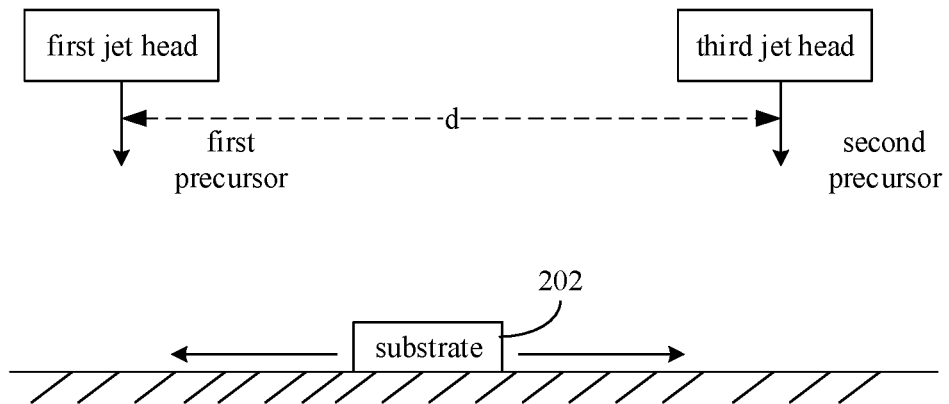
FIG. 11 is a schematic view of an arrangement of jet heads in yet another embodiment.

The second precursor is adapted to react with the first precursor to form the first passivation layer 204. Specifically, referring to FIG. 11, the first precursor and the second precursor are respectively introduced from different jet heads, that is, a first jet head configured to eject the first precursor and a third jet head configured to eject the second precursor. There is a distance d between the first jet region and the third jet region. Specifically, by enlarging the distance between the first jet region and the third jet region, the reaction between the first precursor and the second precursor in areas other than on the substrate 202 can be effectively suppressed, thereby effectively avoiding adhering of the unwanted reaction product to the first surface of the substrate 202, which may affect the reaction on the first surface of the substrate 202 or result in uneven film formation on the first surface of the substrate 202. Further, the distance d is determined according to the flow rates and/or jet pressures of the first precursor and the second precursor. Specifically, the distance d is to satisfy the need of reducing the reaction between the first precursor and the second precursor in areas other than on the substrate 202, so as to improve the passivation effect of the first passivation layer 204. It can be understood that the greater the flow rate or the jet pressure of the first and second precursors, the easier the reaction of the two precursors under the action of gas flow. Therefore, the distance d is positively correlated with the flow rate and jet pressure of the first precursor and/or second precursor, that is, the larger the flow rate and/or jet pressure of the first precursor and/or the second precursor, the larger the distance d so as to improve the spatial separation effect. It can be understood that in the present embodiment, there can be no other jet region to which any other gaseous substance is introduced between the first jet region and the third jet region.

In step 1004, the above step 1002 is repeatedly performed until the thickness of the first passivation layer 204 reaches the first thickness.

In the present embodiment, since the first jet region and the third jet region are separated by a distance d, no additional equipment or gas is needed to ensure that a large proportion of the first precursor and second precursor can react on the first surface of the substrate 202, so that on the premise of ensuring the uniformity and passivation effect of the first passivation layer 204, the structure of the reaction chamber is greatly simplified. Moreover, since the substrate 202 can be placed on the hot plate and is in continuous movement, the method of the present embodiment can reduce the wraparound phenomenon during forming of the first passivation layer 204. The wraparound phenomenon refers to the formation of a non-uniform film or layer on the opposite side of the substrate 202, which affects the appearance and photoelectric conversion performance of the solar cell. Therefore, the present embodiment can effectively reduce the above problems, thereby providing a solar cell with better comprehensive performance.

In some embodiments, the second preparation technique t includes plasma-enhanced chemical vapor deposition (PECVD). That is, the second passivation layer 206 can be formed on the surface of the first passivation layer 204 away from the substrate 202 by using PECVD. PECVD is a thin film deposition technique that uses a discharge phenomenon to ionize atoms of the target material, and then conducts chemical reaction deposition on the substrate. It can be understood that as only one layer of atoms can be formed at a time, which is limited by the reaction mechanism of ALD, the ALD process takes a relatively long time. Thus, the productivity of ALD per unit time is relatively low. Compared with ALD, in PECVD the reaction between the first and second precursors does not need to take place only on the surface of the substrate 202. In other words, there is no need to carry out the steps involving adhering the first precursor to the entire first surface of the substrate 202, discharging the first precursor from the reaction chamber by some treatments, and then introducing the second precursor. Thus, the preparation efficiency of the passivation layers made of the same material is greatly improved. However, the uniformity of the film or layer formed by PECVD is not as good as that by ALD, and the ionization process may cause bombardment damage to the passivation surface, so that the optimal passivation effect is difficult to be achieved simply by PECVD. In the present embodiment, PECVD is adopted to form the second passivation layer 206 at a relatively high speed, and the passivation effect on the substrate 202 can be greatly improved by combining ALD and PECVD.

In an embodiment, the second preparation technique includes alternately performed PECVD and ALD. In the present embodiment, as PECVD and ALD are alternately performed, and the film passivation layer forming speed of PECVD is greater than that of ALD, the second preparation technique including the alternately performed PECVD and ALD can also realize that the layer forming speed by the second preparation technique is greater than the layer forming speed by the first preparation technique, thereby improving the overall efficiency of film preparation.

In an embodiment, a hydrogen content in the first passivation layer 204 is less than that in the second passivation layer 206. The hydrogen content of the passivation layer is related to the corresponding preparation technique. Specifically, taking the first passivation layer 204 and the second passivation layer 206 made of aluminum oxide as an example, PECVD results in a highest hydrogen content in the aluminum oxide, the ALD "time" method (e.g., the embodiment shown in FIG. 4) second, and the ALD "space" method (e.g., the embodiment shown in FIG. 5) lowest. The lower the hydrogen content in the passivation layer, the better the passivation effect. Therefore, by measuring the hydrogen content of the first passivation layer 204 and the second passivation layer 206, the preparation technique can be effectively determined, and the passivation effect of each passivation layer can be known.

In an embodiment, a negative charge density in the first passivation layer 204 is greater than that in the second passivation layer 206. Specifically, the higher the negative charge density at the interface between the passivation layer and the substrate 202 such as the silicon wafer, the stronger the ability to shield the minority carriers on the p-type silicon surface, and the better the field passivation effect. In the present embodiment, the negative charge density in the first passivation layer 204 is greater than that in the second passivation layer 206, so that the passivation effect of the first passivation layer 204 adjacent to the first surface of the substrate 202 is better than that of the second passivation layer 206 away from the substrate 202, which can more effectively improve the photoelectric conversion efficiency of the solar cell. Therefore, by measuring the negative charge density of the first passivation layer 204 and the second passivation layer 206, the passivation effect of each passivation layer can be known.

It should be understood that although the steps in the flow charts involved in the above embodiments are shown sequentially as indicated by the arrows, these steps are not necessarily executed sequentially in the order indicated by the arrows. Unless otherwise specified herein, the sequence of the steps is not strictly limited, and the steps may be performed in other orders. Moreover, at least some of the steps in the flow charts involved in the above embodiments may include multiple sub-steps or multiple stages, and these sub-steps or stages are not necessarily performed at the same time, but may be performed at different times. These sub-steps or stages are not necessarily to be sequentially performed, but can be performed alternately or in turn with at least some of the sub-steps or stages of other steps.

In an embodiment, referring to FIG. 2, the present application further provides a solar cell, and the solar cell includes a substrate 202, a first passivation layer 204, and a second passivation layer 206. The substrate 202 is configured to receive incident light and generate photogenerated carriers. For example, in some embodiments, the solar cell is a bifacial cell, that is, both of the two opposite surfaces of the substrate 202 are configured to receive light. The substrate 202 can be a silicon wafer, and the material of the silicon wafer can include at least one of monocrystalline silicon, polycrystalline silicon, amorphous silicon, or microcrystalline silicon. The first passivation layer 204 is disposed on the first surface of the substrate 202. The second passivation layer 206 is disposed on a surface of the first passivation layer 204 away from the substrate 202. The second passivation layer 206 and the first passivation layer 204 are made of the same material.

In an embodiment, a hydrogen content in the first passivation layer 204 is less than that in the second passivation layer 206. In an embodiment, a negative charge density in the first passivation layer 204 is greater than that in the second passivation layer 206.

In an embodiment, the first thickness of the first passivation layer 204 is less than the second thickness of the second passivation layer 206.

In an embodiment, the first thickness of the first passivation layer 204 is 2 nm to 6 nm.

In an embodiment, the first passivation layer 204 and the second passivation layer 206 are both made of aluminum oxide.

In an embodiment, referring to FIG. 3, the present application also provides a solar cell. The first passivation layer 204 of the solar cell extends to the peripheral side surface of the substrate 202, and the peripheral side surface is connected to the first surface and is parallel to the thickness direction of the substrate 202. The second passivation layer 206 extends to the first passivation layer 204 on the peripheral surface of the substrate 202.

In an embodiment, the first passivation layer 204 and the second passivation layer 206 in the solar cell are formed by the film preparation method in any of the above embodiments. Based on the film preparation method, an embodiment of the present application provides a solar cell with a relatively high passivation layer forming speed and better performance. Correspondingly, an embodiment of the present application also provides a photovoltaic device, which includes a cell group, and the cell group includes a plurality of solar cells of any of the above embodiments or a plurality of solar cells prepared by the film preparation method of the above embodiments. The plurality of solar cells are connected with each other.

The photovoltaic device also includes an encapsulation layer and a cover plate. The encapsulation layer is configured to cover the surface of the cell group, and the cover plate is configured to cover the surface of the encapsulation layer away from the cell group. The solar cells are electrically connected in the form of a whole piece or multiple pieces to form multiple cell groups, and the multiple cell groups are electrically connected in series and/or in parallel. Specifically, in some embodiments, the multiple cell groups can be electrically connected through conducting strips. The encapsulation layer covers the surface of the solar cells. Exemplarily, the encapsulation layer can be an organic encapsulation film, such as an ethylene-vinyl acetate copolymer film, a polyethylene-octene elastomer film or a polyethylene terephthalate film. The cover plate can be with a light-transmitting function, such as a glass cover plate or a plastic cover plate.

An embodiment of the present application also provides a photovoltaic system, including the photovoltaic device in any of the above embodiments.

It can be understood that the photovoltaic system can be applied to photovoltaic power stations, such as ground power stations, roof power stations, water surface power stations, etc., and can also be applied to equipment or devices that use solar energy to generate electricity, such as user solar power supplies, solar street lights, solar cars, solar buildings, etc. It also can be understood that the application scenarios of the photovoltaic system are not limited to the above, that is to say, the photovoltaic system can be applied in all fields that need to use solar energy for power generation. Taking a photovoltaic power generation network as an example, the photovoltaic system can include photovoltaic arrays, a combiner box, and an inverter. The photovoltaic array can be an array of photovoltaic devices. For example, multiple photovoltaic devices can form multiple photovoltaic arrays. The photovoltaic arrays are connected to the combiner box. The combiner box can combine the currents generated by the photovoltaic arrays. The combined current flows through the inverter and is converted into the alternating current suitable for the power grid, and then conducted to the power grid to realize solar power supply.

The technical features of the above embodiments can be combined arbitrarily. In order to make the description concise, not all possible combinations of the technical features are described in the embodiments. However, as long as there is no contradiction in the combination of these technical features, the combinations should be considered as in the scope of the present application.

The above-described embodiments are only several implementations of the present application, and the descriptions are relatively specific and detailed, but they should not be construed as limiting the scope of the present application. It should be understood by those of ordinary skill in the art that various modifications and improvements can be made without departing from the concept of the present application, and all fall within the protection scope of the present application. Therefore, the patent protection of the present application shall be defined by the appended claims.

What is claimed is:

1. A film preparation method, comprising:
    forming a first passivation layer on a first surface of a substrate by using a first preparation technique; and
    forming a second passivation layer on a surface of the first passivation layer away from the substrate by using a second preparation technique, a material of the second passivation layer includes aluminum oxide, and a material of the first passivation layer includes aluminum oxide;
    wherein forming the first passivation layer on the first surface of the substrate by using the first preparation technique includes:
    controlling a substrate to move to sequentially pass through a first jet region, a gas-discharge region, and a third jet region in a reaction chamber, wherein a first precursor is introduced to the first jet region, a second precursor is introduced to the third jet region, the gas-discharge region is configured to discharge gaseous substances in the gas-discharge region from the reaction chamber, and the second precursor is adapted to react with the first precursor to form the first passivation layer; and repeating the above step until a thickness of the first passivation layer reaches a first thickness;

wherein the first thickness of the first passivation layer is smaller than a second thickness of the second passivation layer, the first thickness of the first passivation layer is 2 nm to 6 nm;

wherein the first preparation technique includes atomic layer deposition, a passivation layer forming speed of the first preparation technique is lower than that of the second preparation technique, and a passivation effect of the first passivation layer is greater than that of the second passivation layer.

2. The film preparation method according to claim 1, wherein the passivation effect of the first passivation layer being greater than that of the second passivation layer and includes:

a negative charge density in the first passivation layer is greater than that in the second passivation layer.

3. The film preparation method according to claim 1, wherein in the forming of the first passivation layer on the first surface of the substrate by using the first preparation technique, the first passivation layer is also formed on a peripheral side surface of the substrate, the peripheral side surface is connected to the first surface.

4. The film preparation method according to claim 1, wherein the second preparation technique includes plasma-enhanced chemical vapor deposition or alternately performed plasma-enhanced chemical vapor deposition and atomic layer deposition.

5. The film preparation method according to claim 1, wherein the passivation effect of the first passivation layer being greater than that of the second passivation layer and includes:

a hydrogen content in the first passivation layer is less than that in the second passivation layer.

6. A film preparation method, comprising:

forming a first passivation layer on a first surface of a substrate by using a first preparation technique, including:

controlling the substrate to move to sequentially pass through a first jet region, a second jet region, and a third jet region, wherein a first precursor is introduced to the first jet region from a moment that the substrate enters the first jet region, a spacing gas is constantly introduced to the second jet region, and a second precursor is introduced to the third jet region from a moment that the substrate enters the third jet region, the second precursor is adapted to react with the first precursor to form the first passivation layer, the spacing gas is configured to space the first precursor from the second precursor, thereby suppressing a reaction between the first precursor and the second precursor in an area other than on the first surface of the substrate; and forming a second passivation layer on a surface of the first passivation layer away from the substrate by using a second preparation technique, a material of the second passivation layer including aluminum oxide, and a material of the first passivation layer including aluminum oxide;

wherein a passivation layer forming speed of the first preparation technique is lower than that of the second preparation technique, and a passivation effect of the first passivation layer is greater than that of the second passivation layer.

7. The film preparation method according to claim 6, wherein a distance between the first jet region and the third jet region is determined according to jet flow rates and/or jet pressures of the first precursor and the second precursor.

8. A film preparation method, comprising:

forming a first passivation layer on a first surface of a substrate by using a first preparation technique; and forming a second passivation layer on a surface of the first passivation layer away from the substrate by using a second preparation technique, a material of the second passivation layer including aluminum oxide, and a material of the first passivation layer including aluminum oxide;

wherein the first preparation technique includes atomic layer deposition, a passivation layer forming speed of the first preparation technique is lower than that of the second preparation technique, and a hydrogen content in the first passivation layer is less than that in the second passivation layer.

* * * * *